(12) United States Patent
Nishimura et al.

(10) Patent No.: US 9,640,655 B2
(45) Date of Patent: May 2, 2017

(54) SEMICONDUCTOR DEVICE AND MANUFACTURING METHOD OF SEMICONDUCTOR DEVICE

(71) Applicants: Shinya Nishimura, Toyota (JP); Narumasa Soejima, Seto (JP); Kensaku Yamamoto, Okazaki (JP)

(72) Inventors: Shinya Nishimura, Toyota (JP); Narumasa Soejima, Seto (JP); Kensaku Yamamoto, Okazaki (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 14/762,607

(22) PCT Filed: Jan. 24, 2013

(86) PCT No.: PCT/JP2013/051443
§ 371 (c)(1),
(2) Date: Jul. 22, 2015

(87) PCT Pub. No.: WO2014/115280
PCT Pub. Date: Jul. 31, 2014

(65) Prior Publication Data
US 2016/0005861 A1    Jan. 7, 2016

(51) Int. Cl.
*H01L 29/78* (2006.01)
*H01L 29/10* (2006.01)
(Continued)

(52) U.S. Cl.
CPC ........ *H01L 29/7834* (2013.01); *H01L 21/225* (2013.01); *H01L 21/2652* (2013.01);
(Continued)

(58) Field of Classification Search
CPC .................. H01L 29/7834; H01L 21/225
See application file for complete search history.

(56) References Cited

U.S. PATENT DOCUMENTS 7,427,800 B2 * 9/2008 Yilmaz ............... H01L 29/0619
257/488
2006/0289928 A1   12/2006 Takaya et al.
(Continued)

FOREIGN PATENT DOCUMENTS

JP    H01-120842 A    5/1989
JP    2004-221245 A   8/2004
(Continued)

OTHER PUBLICATIONS

Jul. 28, 2015 International Preliminary Report on Patentability issued in International Patent Application No. PCT/JP2013/051443.

*Primary Examiner* — Su C Kim
*Assistant Examiner* — David S Wilbert
(74) *Attorney, Agent, or Firm* — Oliff PLC (57) ABSTRACT

A semiconductor device is provided with: a first conductivity type contact region; a second conductivity type body region; a first conductivity type drift region of; a trench formed through the contact region and body region from a front surface of the semiconductor substrate, wherein a bottom of the trench is positioned in the drift region; an insulating film covering an inner surface of the trench; a gate electrode accommodated in the trench in a state covered with the insulating film; and a second conductivity type floating region formed at a position deeper than the bottom of the trench, and adjacent to the bottom of the trench. The floating region includes a first layer adjacent to the bottom of the trench and a second layer formed at a position deeper than the first layer, wherein a width of the first layer is broader than a width of the second layer.

4 Claims, 7 Drawing Sheets

(51) Int. Cl.

| | | |
|---|---|---|
| *H01L 21/311* | (2006.01) | |
| *H01L 21/306* | (2006.01) | |
| *H01L 21/225* | (2006.01) | |
| *H01L 21/31* | (2006.01) | |
| *H01L 29/423* | (2006.01) | |
| *H01L 29/66* | (2006.01) | |
| *H01L 29/06* | (2006.01) | |
| *H01L 21/265* | (2006.01) | |
| *H01L 21/28* | (2006.01) | |

(52) U.S. Cl.
CPC .. *H01L 21/28238* (2013.01); *H01L 21/30604* (2013.01); *H01L 21/31* (2013.01); *H01L 21/31116* (2013.01); *H01L 29/0623* (2013.01); *H01L 29/1095* (2013.01); *H01L 29/4236* (2013.01); *H01L 29/66621* (2013.01); *H01L 29/66666* (2013.01); *H01L 29/66734* (2013.01); *H01L 29/7813* (2013.01); *H01L 29/7841* (2013.01)

(56) References Cited

U.S. PATENT DOCUMENTS

| | | | |
|---|---|---|---|
| 2008/0185594 A1* | 8/2008 | Frisina | H01L 29/0634 257/77 |
| 2010/0155840 A1* | 6/2010 | Tu | H01L 29/0634 257/341 |
| 2012/0282746 A1* | 11/2012 | Hebert | H01L 21/26586 438/270 |

FOREIGN PATENT DOCUMENTS

| | | |
|---|---|---|
| JP | 2005-116822 A | 4/2005 |
| JP | 2005-340552 A | 12/2005 |
| TW | 201025602 A | 7/2010 |

* cited by examiner

SEMICONDUCTOR DEVICE AND MANUFACTURING METHOD OF SEMICONDUCTOR DEVICE

TECHNICAL FIELD

A technology disclosed in this specification relates to a semiconductor device and a manufacturing method thereof.

BACKGROUND ART

A semiconductor device having a trench gate structure has been disclosed in, for example, JP 2005416822 A (hereafter referred to as Patent Document 1). This semiconductor device includes: an n-type source region; a p-type body region; an n-type drift region; an n-type drain, region; a trench; a gate electrode; and a p-type floating region. The source region is formed on a front surface side of a semiconductor substrate. The body region is formed under the source region. The drift region is formed under the body region. The drain region is formed under the drift region. The trench is formed through the source region and the body region from the front surface of the semiconductor substrate, and a bottom of the trench is positioned in the drift region. The gate electrode is accommodated in the trench in a state of being covered by an insulating film. The floating region is formed directly under the trench.

In the semiconductor device of Patent Document 1, while a gate voltage is off, a depletion layer spreads from a pn-junction part between the body region and the drift region, and a depletion layer spreads also from a pn-junction part between the floating region and the drift region. That is, since the semiconductor device in Patent Document 1 has the floating region depletion of the drift region is promoted, and achievement of higher withstand voltage between the source and the drain is thereby intended.

SUMMARY OF INVENTION

Technical Problem if a floating region is formed to a deep position in a region, an electric field reduction effect is enhanced since a depletion layer is formed up to the deep position in the drift region. In order to form the floating region to the deep position, impurities need to be injected to a trench by high energy. When the impurities are injected by the high energy, a side surface of the trench needs to be covered with a thick protective film in order to suppress the injection of the impurities into the side surface of the trench. However, when the side surface of the trench is covered with the thick protective film, the impurities may not sufficiently be injected near a periphery (hereafter referred to as a 'corner') of a bottom of the trench, and a width of an entire floating region may undesirably become narrow. In that case, concentration of electric field near the corner is not reduced, and a withstand voltage of the semiconductor device may decrease.

Contrary to this, if a floating region having a broad width is formed, the concentration of electric field near the corner can be reduced, and a higher withstand voltage can be promoted for a semiconductor device. In order to form the floating region having a broad width, the side surface of a trench cannot be covered with the thick protective film when impurities are injected to the trench. However, when the side surface of the trench is covered with a thin protective film, impurities need to be injected by low energy in order to suppress the injected impurities from damaging the side surface of the trench. For this reason, the floating region cannot be formed to a deep position in the drift region, and a depth of the entire floating region becomes shallow. As a result, a depletion layer is not formed to a deep position in the drift region, and it is not possible to enhance the withstand voltage of a semiconductor device.

This specification provides a semiconductor device capable of enhancing a withstand voltage of an entire semiconductor device while a side surface of a trench is protected, as compared with the conventional configuration.

Solution to Technical Problem

An aspect of a technique described in this specification is a semiconductor device. The semiconductor device may comprise: a contact region of a first conductivity type; a body region of a second conductivity type; a drift region of the first conductivity type; a trench; an insulating film; a gate electrode; and a floating region of the second conductivity type. The contact region may be formed at a front surface side of a semiconductor substrate. The body region may be formed at a position deeper than the contact region, and adjacent to the contact region. The drift region may be formed at a position deeper than the body region, and separated from the contact region by the body region. The trench may be formed through the contact region and body region from a front surface of the semiconductor substrate, wherein a bottom of the trench is positioned in the drift region. The insulating film may cover an inner surface of the trench. The gate electrode may be accommodated in the trench in a state of being covered by the insulating film. The floating region may be formed at a position deeper than the bottom of the trench, and adjacent to the bottom of the trench. The floating region may comprise a first layer adjacent to the bottom of the trench and a second layer formed at a position deeper than the first layer. A width of the first layer is broader than a width of the second layer. Here, "the width of the first layer (the second layer)" means a length (a dimension) in a direction orthogonal to a longitudinal direction of the trench when the semiconductor substrate is viewed in plan.

In the semiconductor device mentioned above, the floating region comprises the first layer adjacent to the bottom of the trench and the second layer formed at the position deeper than the first layer. The width of the first layer is broader than the width of the second layer. Accordingly, the concentration of electric field can be reduced near the periphery (corner) of the bottom of the trench. Moreover, since the first layer is formed at a shallower position in the drift region than the second layer, the damage to the side surface of the trench can be suppressed even if the width of the first layer is widened. Furthermore, in the semiconductor device mentioned above, the floating region comprises the second layer formed at a position deeper than the first layer. Accordingly, a depletion layer can be formed to a deep position in the drift region. On the other hand, since the width of the second layer is narrower than the width of the first layer, the damage to the side surface of the trench can be suppressed even if the second layer is formed to the deep position in the drift region. Therefore, the withstand voltage of the entire semiconductor device can be enhanced while the side surface of the trench is being protected.

This specification further discloses a novel manufacturing method of a semiconductor device. The manufacturing method of a semiconductor device disclosed in this specification may comprise: forming a trench; injecting impurities by first injection energy; forming a protective film; and further injecting impurities by second injection energy. The forming of a trench may include forming a trench extending from a front surface of a semiconductor substrate in a depth direction. The injecting of the impurities by the first injection energy may include injecting impurities of a second conductivity type to a bottom of the formed trench by the first injection energy. The forming of a protective film may include forming a protective film covering at least a side surface of the trench after the impurities of the second conductivity type had been injected to the bottom of the trench. The injecting of the impurities by the second injection energy may include further injecting impurities of the second conductivity type to the bottom of the trench by the second injection energy that is larger than the first injection energy, after the protective film had been formed. The injecting of the impurities by the first injection energy may include injecting impurities of the second conductivity type in a state where a protective film is not formed on at least the side surface of the formed trench, or in a state where a protective film, that is thinner than the protective film formed in the forming of the protective film is formed on at least the side surface of the formed trench.

According to the method mentioned above, in the injecting of the impurities by the first injection energy an impurity layer (the above first layer) which has a broader width and a shallower depth than an impurity layer (the above second layer) formed in the injecting of the impurities by the second injection energy can be formed. In the injecting of the impurities by the second injection energy, the impurity layer (the second layer) which has a narrower width and a deeper depth than the impurity layer (the first layer) formed in the injecting of the impurities by the first injection energy can be formed. That is, the semiconductor device disclosed in this specification and described above can be manufactured according to this method.

DESCRIPTION OF EMBODIMENTS

Some of technical features will be listed for the embodiments explained below. Technical features described below are respective independent features which provide technical utility either independently or through various combinations and which are not limited to the combinations described at the time the claims are filed.

(Feature 1) The width of the first layer may be identical to or broader than a width of the bottom of the trench. In this case, since the first layer can be formed near the corner, the concentration of electric field near the corner can be effectively suppressed.

(Feature 2) The width of the first layer may be identical to narrower than a width of the bottom of the trench. In this case, since the spread of a depletion layer in a transverse direction is suppressed, an on-resistance can be reduced.

(Feature 3) The protective film may be a sacrificial oxide film formed by oxidation of the front surface of the semiconductor substrate. The manufacturing method of a semiconductor device may further comprise removing the sacrificial oxide film after the impurities of the second conductivity type had been injected by the second injection energy. According to this configuration, since the protective film herein is the sacrificial oxide film formed by oxidation of the front surface of the semiconductor substrate, even if the side surface of the trench is damaged by the impurities as a result of injecting impurities by the first injection energy, the damaged portion can be included in the sacrificial oxide film. Therefore, by removing the sacrificial oxide film, it becomes unlikely that the damage caused by the impurities remains in the side surface or the like of the trench. Increase of a gate threshold voltage of a semiconductor device that is manufactured can be suppressed.

First Embodiment

Figure 1:
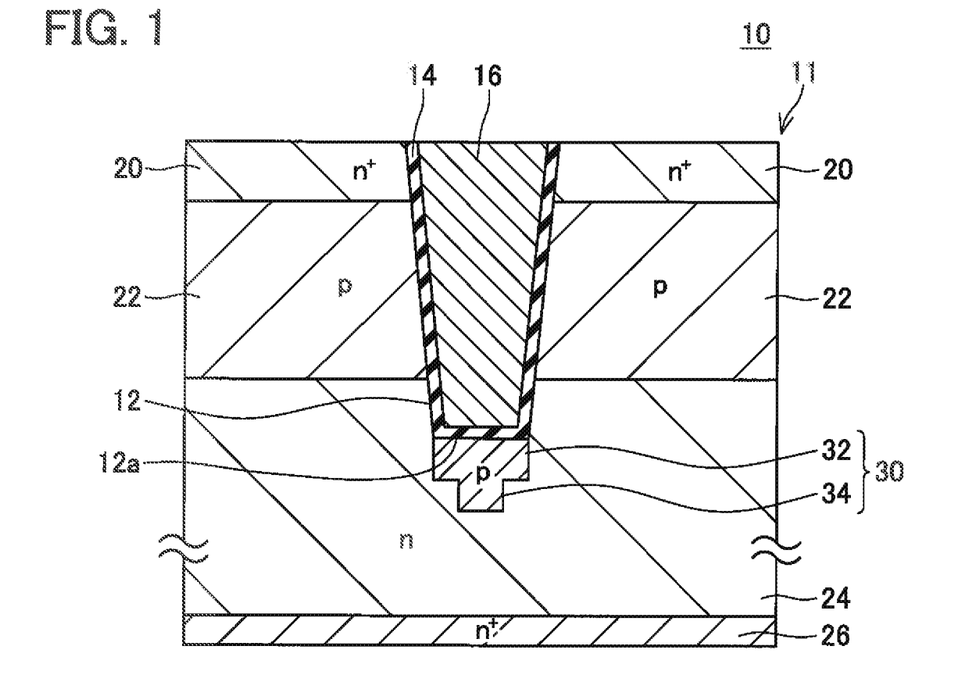
FIG. 1 is a schematic sectional view of a semiconductor device 10 of a first embodiment.

A semiconductor device 10 shown in FIG. 1 is formed by a semiconductor substrate 11 mainly made of SiC, respective types of electrodes, insulating films, and metal wirings and the like. The semiconductor device 10 of this embodiment is a vertical MOSFET. In FIG. 1, illustration of an insulating film, the electrodes, and the like provided on a front surface side and a back surface side of the semiconductor substrate 11 is omitted.

As shown in FIG. 1, a source region 20, a body region 22, a drift region 24, a drain region 26, a trench 12, a gate insulating film 14, a gate electrode 16 and a floating region 30 are formed in the semiconductor substrate 11.

The source region 20 is formed in an area exposed on a front surface of the semiconductor substrate 11. The source region 20 is an n-type region with a high impurity density. A surface of the source region 20 is connected to a front surface electrode (not illustrated) by an ohmic contact.

The body region 22 is formed at a position deeper than the source region 20, and is adjacent to the source region 20. The body region 22 is formed in a range that is shallower than a lower end of the trench 12. The body region 22 is a p-type region.

The drift region 24 is formed at a position deeper than the body region 22. The drift region 24 is separated from the source region 20 by the body region 22. The drift region 24 is an n-type region with a low impurity density.

The drain region 26 is formed at a position deeper than the drift region 24. The drain region 26 is an n-type region with a high impurity density. A back surface of the drain region 26 is connected to a back surface electrode (not illustrated) by an ohmic contact.

The trench 12 is formed through the source region 20 and the body region 22 from the front surface of the semiconductor substrate 11. The lower end of the trench 12 in a depth direction protrudes into the drift region 24 from the lower end of the body region 22. In this embodiment, a width of an opening of the trench 12 is formed broader than a width of a bottom 12a of the trench 12. That is, the trench 12 is formed in a tapered shape where the width of the trench 12 becomes narrower toward the bottom 12a. Since the trench 12 is formed in the tapered shape, the concentration of electric field becomes easily reduced at a shoulder of the trench 12 (in a vicinity of the opening of the trench 12), and a higher withstand voltage can be attained. Moreover, since the trench 12 is formed in the tapered shape, there is also an advantage that it becomes difficult for voids to be formed when the gate electrode 16 is formed in the trench 12. The "width of the trench 12" means a length (a dimension) in a direction orthogonal to the longitudinal direction of the trench 12 (transverse direction in FIG. 1) when the semiconductor substrate 11 is viewed in plan. Hereafter, if a "width" is used in this specification, it means a length in the same direction as mentioned above.

A gate insulating film 14 covers an inner surface of the trench 12. The gate electrode 16 is accommodated in the trench 12 in a state where the gate electrode 16 is covered with the gate insulating film 14. The gate electrode 16 is insulated from the front surface electrode (illustration omitted), with a front surface of the gate electrode 16 being covered with an insulating layer (illustration omitted). However, the gate electrode is connected with a gate wiring (not illustrated) at a different position.

The floating region 30 is formed at a position deeper than the bottom 12a of the trench 12 and is adjacent to the bottom of the trench 12. The floating region 30 is a p-type region. The floating region 30 comprises a first layer 32 adjacent to the bottom 12a of the trench 12 and a second layer 34 formed at a position deeper than the first layer 32. As shown in the figures, a width of the first layer 32 is broader than a width of the second layer 34. Moreover, in this embodiment, the width of the first layer 32 is substantially identical to a width of the bottom 12a of the trench 12.

A configuration of the semiconductor 10 of this embodiment has been explained as above. As mentioned above, in the semiconductor device 10 of this embodiment, the floating region 30 comprises the first layer 32 adjacent to the bottom 12a of the trench 12. The width of the first layer 32 is broader than the width of the second layer 34. Moreover, the width of the first layer 32 is substantially identical to the width of the bottom 12a of the trench 12. Accordingly, the concentration of electric field near the periphery of the bottom 12a (hereafter referred to as a "corner") of the trench 12 can be reduced when compared with a conventional configuration where a floating region is formed to a deep position in a drift region but a width of the entire floating region is narrow. Moreover, since the first layer 32 is formed at a shallower position in the drift region 24 than the second layer 34, damage to the side surface of the trench 12 can be suppressed even if the width of the first layer 32 is widened. Moreover, in the semiconductor device 10 of this embodiment, the floating region 30 comprises the second layer 34 formed at a position deeper than the first layer 32. Accordingly, a depletion layer can be formed to a deeper position in the drift region 24 when compared with a conventional configuration where there is a wide floating region but a depth of the entire floating region is shallow. In the meantime, since the width of the second layer 34 is narrower than the width of the first layer 32, damage to the side surface of the trench 12 can be suppressed even if the second layer 34 is formed to a deep position in the drift region 24. Therefore, the withstand voltage of the entire semiconductor device 10 can be enhanced while the side surface of the trench 12 is protected.

Figure 2:
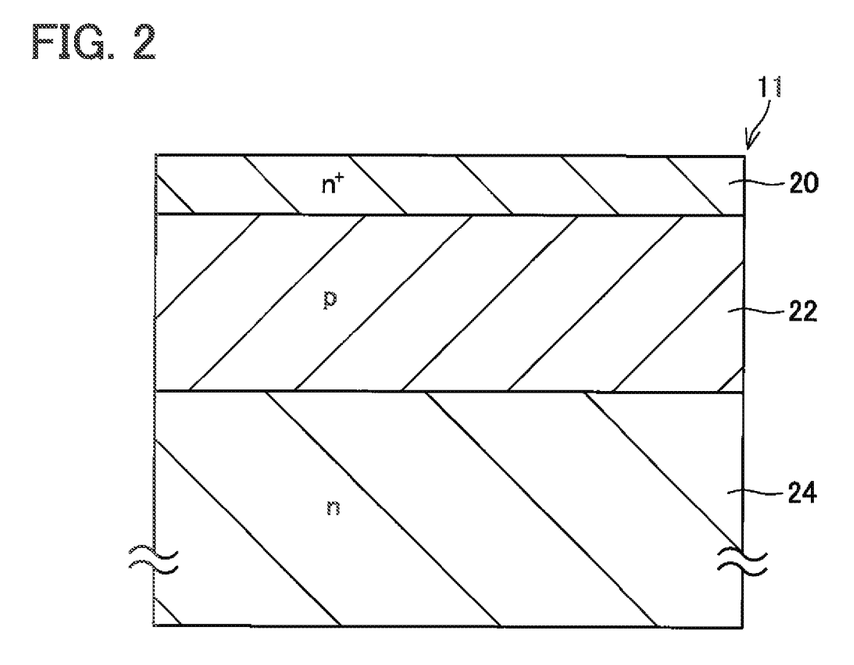
FIG. 2 is a sectional view (1) explaining a manufacturing process of the semiconductor 10.
Figure 3:
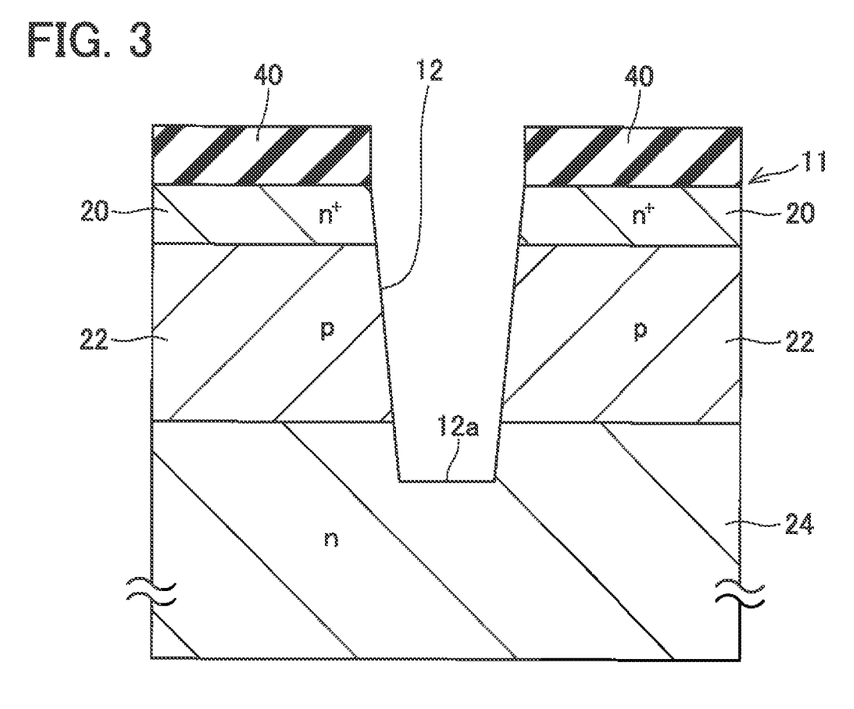
FIG. 3 is a sectional view (2) explaining the manufacturing process of the semiconductor 10.

Subsequently, a manufacturing method of the semiconductor device 10 of this Embodiment is explained. First, as shown in FIG. 2, a semiconductor substrate 11 on which a source region 20, a body region 22 and a drift region 24 are formed is prepared. Next, an oxide film 40 (see FIG. 3) is formed on an entire front surface of the semiconductor substrate 11. The oxide film 40 can be formed by a CVD method. After the oxide film 40 is formed, a portion of the oxide film 40, which corresponds to a portion on which a trench 12 is to be formed, is removed. Then, as shown in FIG. 3, dry etching is performed on the semiconductor substrate 11 by using the oxide film 40 remaining on the surface of the semiconductor substrate 11 as a mask, to form the trench 12. In this case, the trench 12 is formed in a tapered shape where a width of the trench 12 becomes narrower toward a bottom 12a.

Figure 4:
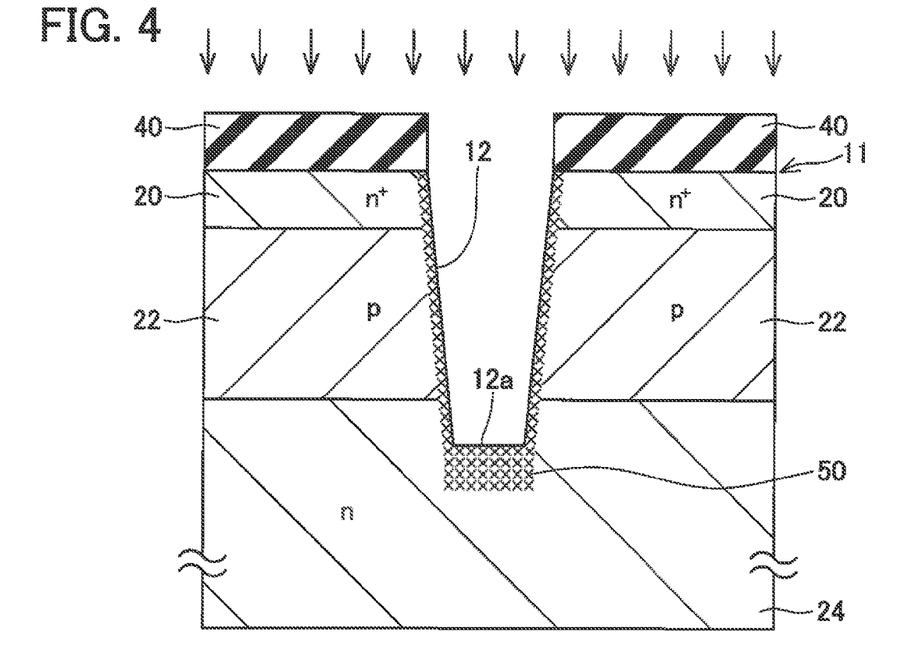
FIG. 4 is a sectional view (3) explaining the manufacturing process of the semiconductor 10.

Next, as shown in FIG. 4, with the oxide film 40 remaining on the surface of the semiconductor substrate 11, p-type impurities are injected to the bottom 12a of the trench 12 by first injection energy. The first injection energy is lower than second injection energy (see FIG. 6) to be mentioned later. In this embodiment, a protective film (a sacrificial oxide film etc.) has not been formed inside the trench 12 at this point. Accordingly, a p-type region 50 is formed by injecting the p-type impurities into the drift region 24 adjacent to the bottom 12a (including a corner) of the trench 12. As mentioned above, since the first injection energy is lower than the second injection energy to be mentioned later, the p-type region 50 is formed in a relatively shallow range in the drift region 24 adjacent to the bottom 12a of the trench 12. Moreover, since the trench 12 is formed in the tapered shape where the width thereof becomes narrower toward the bottom 12a, the p-type impurities are also injected to and the p-type region 50 is formed in a portion, which is adjacent to the side surface of the trench 12, among the source region 20, the body region 22 and the drift region 24. However, since the first injection energy is low, the p-type region 50 is not formed to a deep position from the side surface of the trench 12. Since the oxide film 40 is formed on the front surface of the semiconductor substrate 11, the p-type impurities are not injected into the front surface of the semiconductor substrate 11.

Figure 5:
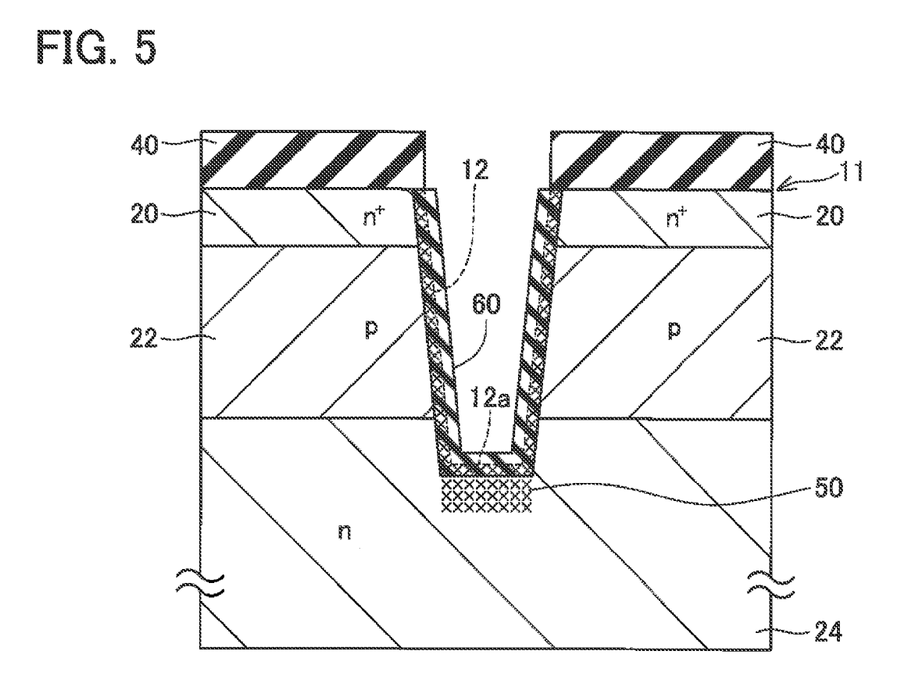
FIG. 5 is a sectional view (4) explaining the manufacturing process of the semiconductor 10.

Next, as shown in FIG. 5, a sacrificial oxide film 60 is formed on the inner surface of the trench 12. The sacrificial oxide film 60 can be formed by an arbitrary and known sacrificial oxidation method (a wet oxidation method, a dry oxidation method, etc.). Thereby, the p-type region 50, which has been formed in the portion adjacent to the side surface of the trench 12, is oxidized to become a part of the sacrificial oxide film 60. Moreover, the p-type region 50, which has been formed in the portion adjacent to the bottom 12a of the trench 12, is also oxidized to become a part of the sacrificial oxide film 60. Moreover, when the semiconductor substrate 11 is oxidized to form the sacrificial oxide film 60, a volume of the semiconductor substrate 11 after the oxidation becomes larger than that before the oxidation. Accordingly, an inner surface of the sacrificial oxide film 60 is positioned closer to a center of the trench 12 than the inner surface of the trench 12 (see FIG. 3) before the sacrificial oxide film 60 is formed.

Figure 6:
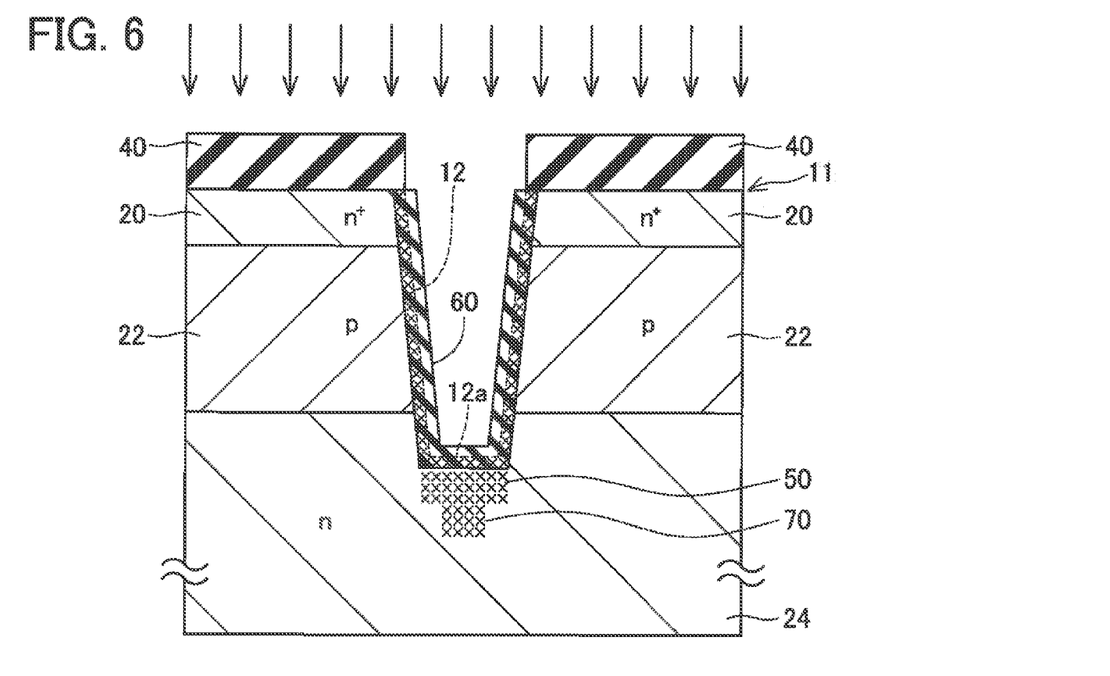
FIG. 6 is a sectional view (5) explaining the manufacturing process of the semiconductor 10.

Next, as shown in FIG. 6, in a state where the sacrificial oxide film 60 is formed, the p-type impurities are injected to the bottom 12a of the trench 12 by the second injection energy. The second injection energy is higher than the first injection energy mentioned above. Accordingly, the p-type impurities are injected to a position deeper than the p-type region 50 in the drift region 24 to form a p-type region 70. However, since the inner surface (side surface) of the trench 12 is covered with the thick sacrificial oxide film 60, an area where the p-type impurities are injected becomes narrower than when the p-type impurities were injected in FIG. 4. Accordingly, a width of the p-type region 70 that is herein formed becomes narrower than a width of the p-type region 50. Similarly, since the side surface of the trench 12 is covered with the sacrificial oxide film 60, the p-type impurities are hardly injected into a portion, which is adjacent to the side surface of the trench 12 among the source region 20, body region 22 and drift region 24. Accordingly, the p-type region 70 is hardly formed in the portion adjacent to the side surface of the trench 12. Also in this case, since the oxide film 40 is formed on the front surface of the semiconductor 11, the p-type impurities are not injected into the front surface of the semiconductor substrate 11.

Figure 7:
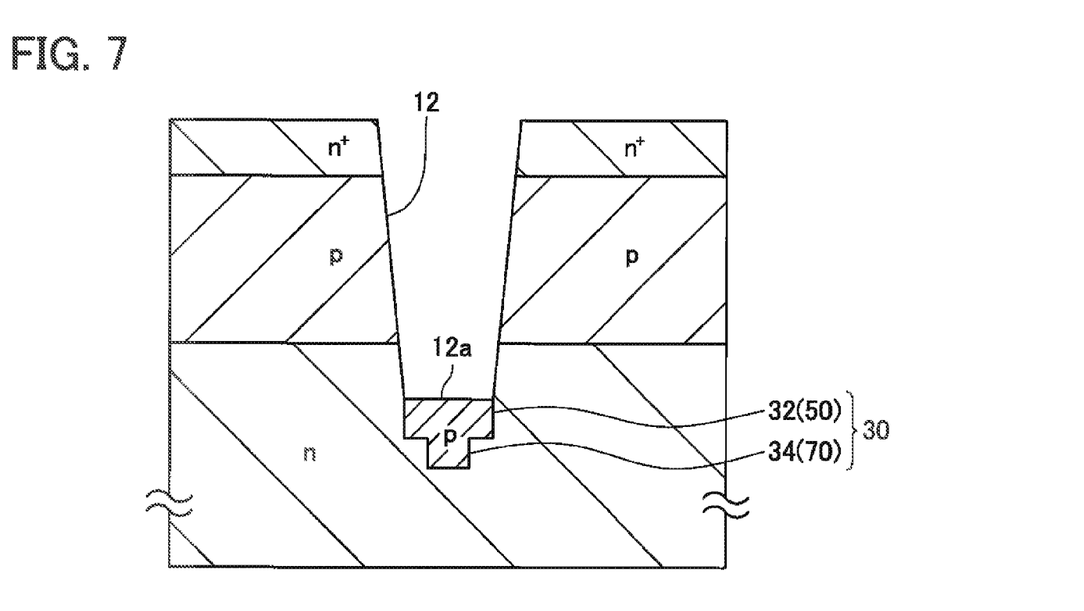
FIG. 7 is a sectional view (6) explaining the manufacturing process of the semiconductor 10.

Then, as shown in FIG. 7, the oxide film 40 on the surface of the semiconductor substrate 11 and the sacrificial oxide film 60 of the inner surface of the trench 12 are removed. The oxide film 40 and the sacrificial oxide film 60 can be removed by wet etching using fluoric acid solution. With the sacrificial oxide film 60 removed, the inner surface of the trench 12 is exposed. That is, the p-type region 50 formed on the side surface of the trench 12 is also removed together with the sacrificial oxide film 60. Since a portion of the inner surface of the trench 12 included in a part of the sacrificial oxide film 60 is removed, the inner surface of the trench 12 is positioned on an outer side than the inner surface of the trench 12 which was initially formed (see FIG. 3).

Then, thermal diffusion processing is performed. As a result, the floating region 30 of FIG. 1 is formed by the p-type region 50 and the p-type region 70, which are formed in the drift region 24. The p-type regions 50 and 70 correspond to the second layer 34 and the first layer 32 of FIG. 1, respectively.

Then, a gate insulating film 14 is formed on the inner surface of the trench 12, and a gate electrode 16 is formed inside the gate insulating film 14. Furthermore, a predetermined surface structure (a front-surface electrode etc.) is formed on the front surface of the semiconductor substrate 11. Furthermore, the back surface of the semiconductor substrate 11 is ground to thin the semiconductor substrate 11, and n-type impurities are injected to the back surface of the semiconductor substrate 11 to form a drain region 26. Then, a predetermined back-surface structure (a back-surface electrode etc.) is formed on the back surface of the semiconductor substrate 11 to complete the semiconductor device 10 as shown in FIG. 1.

As above, the manufacturing method of the semiconductor device 10 of this embodiment has been explained. As shown in FIG. 4, by injecting the p-type impurities by the first injection energy, the p-type region 50 corresponding to the first layer 32 of FIG. 1 can be formed. Moreover, as shown in FIG. 6, by injecting the p-type impurities by the second injection energy, the p-type region 70 corresponding to the second layer 34 of FIG. 1 can be fumed. The p-type region 50 has a broader width and a shallower depth than the p-type region 70. On the other hand, the p-type region 70 has a narrower width and a deeper depth than the p-type region 50. A reason why the p-type regions 50 and 70 are formed in this manner is mentioned as above. Therefore, the semiconductor device 10 of this embodiment can be manufactured according to the manufacturing method of this embodiment.

Moreover, in the manufacturing method of this embodiment, as shown in FIG. 5, the sacrificial oxide film 60 is formed on the inner surface of the trench 12 after the p-type impurities are injected by the first injection energy. The sacrificial oxide film 60 includes the p-type region 50 formed in the portion adjacent to the side surface of the trench 12. Then, as shown in FIG. 7, the sacrificial oxide film 60 is removed after the p-type impurities are injected by the second injection energy. Thereby, the p-type region 50 formed on the side surface of the trench 12 is removed together with the sacrificial oxide film 60. That is, it becomes unlikely that the p-type impurities (damage caused by the p-type impurities) remain in the side surface of the trench 12. Accordingly, the increase of the gate threshold voltage of the semiconductor device 10 that is manufactured can be suppressed.

A corresponding relationship between this embodiment and the claims is explained as below. The source region 20 is an example of a "contact region". The forming of the trench 12, which is explained in FIG. 3, is an example of "forming a trench". The injecting of the p-type impurities, which is explained in FIG. 4, is an example of "injecting impurities of a second conductivity type to a bottom of the formed trench by first injection energy". The forming of the sacrificial oxide film 60, which is explained in FIG. 5, is an example of "forming a protective film". The injecting of the p-type impurities, which is explained in FIG. 6, is an example of "further injecting impurities of the second conductivity type to the bottom of the trench by second injection energy". The removing of the oxide film 40 and the sacrificial oxide film 60, which is explained in FIG. 7, is an example of "removing the sacrificial oxide film".

Second Embodiment

A second embodiment is explained, focusing on different points from the first embodiment. Also in this embodiment, the configuration of the semiconductor device 10 is almost the same as that in the first embodiment. In this embodiment, there is a difference from the first embodiment partly in the manufacturing method of the semiconductor device 10. In the first embodiment, as shown in FIG. 4, when the p-type impurities are injected to the bottom 12a of the trench 12 by the first injection energy, a protective film (a sacrificial oxide film etc.) has not been formed on the inner side of the trench 12. On the other hand, in this embodiment, as shown in FIG. 8, when the p-type impurities are injected to the bottom 12a of the trench 12 by the first injection energy, an oxide film 80 has been formed in advance on the inner surface of the trench 12, which is a different point from the first embodiment.

Figure 8:
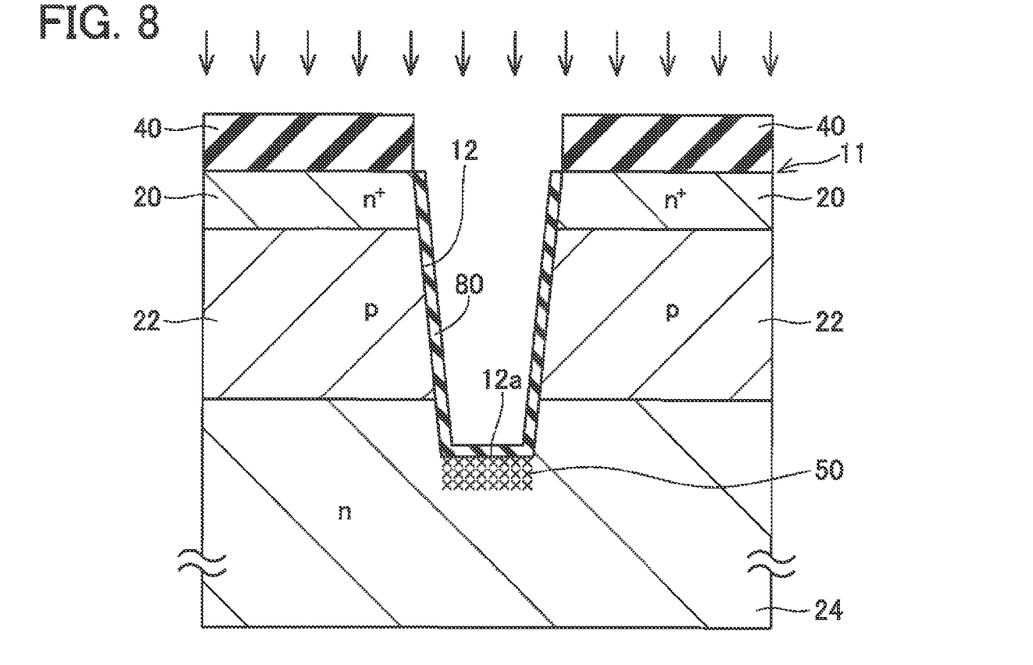
FIG. 8 is a sectional view (1) explaining a manufacturing process of the semiconductor device 10 of a second embodiment.

The oxide film 80 shown in FIG. 8 is an oxide film formed by a CVD method. A thickness of the oxide film 80 is thinner than a thickness of an oxide film 90 (see FIG. 9) that will be formed later. In this embodiment, when the p-type impurities are injected by the first injection energy, part of the injected impurities penetrates through the thin oxide film 80. Accordingly, the p-type impurities are injected into the drift region 24 adjacent to the bottom 12a (including the corner) of the trench 12, and a p-type region 50 is formed in an almost identical manner to the first embodiment. On the other hand, since the side surface of the trench 12 is covered with the oxide film 80, the p-type impurities are hardly injected to a portion, which is adjacent to the side surface of the trench 12, among the source region 20, the body region 22 and the drift region 24.

Figure 9:
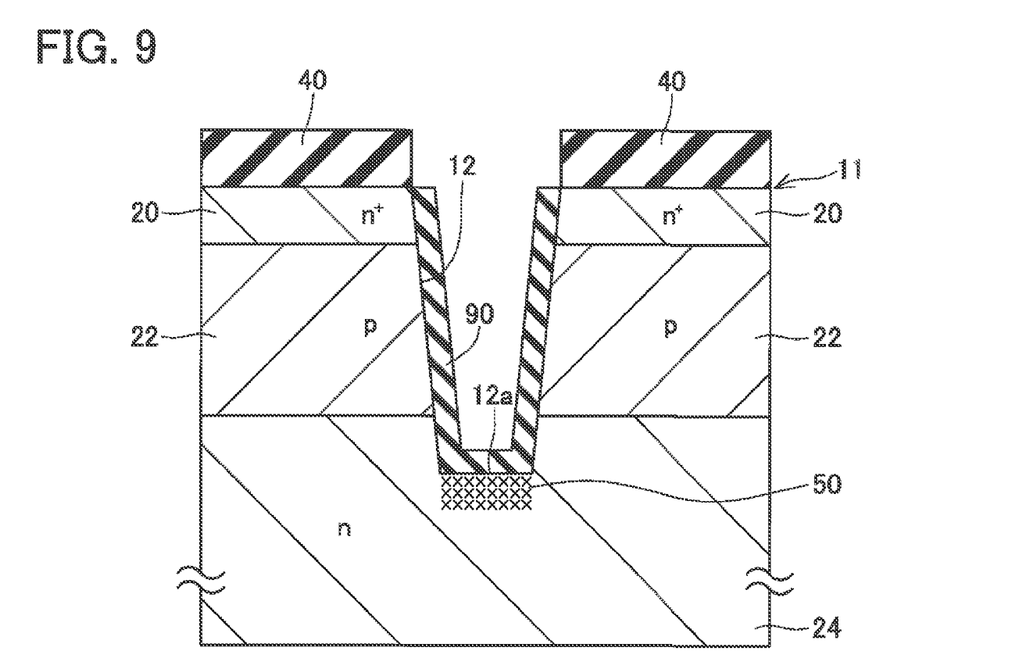
FIG. 9 is a sectional view (2) explaining the manufacturing process of the semiconductor device 10 of the second embodiment.

Next, as shown in FIG. 9, without removing the oxide film 80, the thick oxide film 90 is further formed on the oxide film 80 by the CVD method. Thereafter, similarly to the case of FIG. 6, the p-type impurities are injected by the second injection energy. As a result, a p-type region 70 is formed similarly to the case of FIG. 6. Thereafter, similarly to the case of FIG. 7, the oxide film 40 and the oxide film 90 are removed. Each of subsequent processes is the same as that of the first embodiment.

Also in the manufacturing method of this embodiment, a semiconductor device similar to the semiconductor device 10 of FIG. 1 can be manufactured, similarly to the case of the first embodiment. In this embodiment, the injecting of the p-type impurities, which is explained in FIG. 8, is an example of "injecting impurities of a second conductivity type to a bottom of the formed trench by first injection energy". The forming of the oxide film 90, which is explained in FIG. 9, is an example of "forming a protective film".

Third Embodiment

Figure 10:
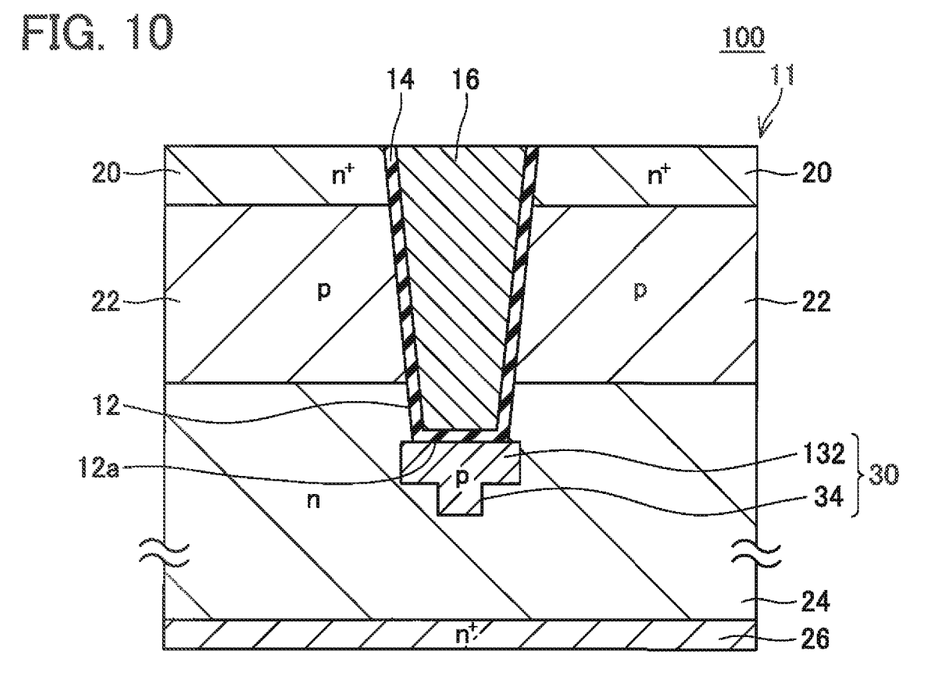
FIG. 10 is a schematic sectional view of a semiconductor 100 of a third embodiment.

A third embodiment is explained, focusing on different aspects from the first embodiment. As shown in FIG. 10, in a semiconductor device 100 of this embodiment, a configuration of a first layer 132 of a floating region 30 is different from that of the first embodiment. In the first embodiment, the width of the first layer 32 is formed to be almost identical to the width of the bottom 12a of the trench 12. Contrary to this, in this embodiment, a width of the first layer 132 is formed broader than the width of the bottom 12a of the trench 12. Accordingly, in the semiconductor device 100 of this embodiment, since the first layer 132 can be arranged near the corner of the trench 12, the concentration of electric field near the corner can be effectively suppressed.

A manufacturing method of the semiconductor device 100 of this embodiment is fundamentally common to the manufacturing method of the first embodiment mentioned above. However, in this embodiment, when the p-type impurities are injected to the bottom 12a of the trench 12 by the first injection energy, the impurities are injected not only in a vertical direction relative to the bottom 12a of the trench 12 (see FIG. 4) but also in an oblique direction relative to the bottom 12a of the trench 12, which is a different aspect from the method of the first embodiment. As a result, in this embodiment, a p-type region is formed in an area broader than the width of the bottom 12a of the trench 12. When the impurities are injected in the oblique direction relative to the bottom 12a of the trench 12, the p-type impurities are injected to the side surface of the trench 12 to form the p-type region. However, also in this embodiment, similarly to the first embodiment, a sacrificial oxide film 60 (see FIG. 5) is then formed on the inner surface of the trench 12, and the p-type impurities are injected by the second injection energy (see FIG. 6); after that, by removing the sacrificial oxide film 60, the p-type region, which has been formed on the side surface of the trench 12, is removed together with the sacrificial oxide film 60 (see FIG. 7). Accordingly, it becomes difficult for the p-type impurities (the damage caused by the p-type impurities) to remain on the side surface of the trench 12.

Fourth Embodiment

Figure 11:
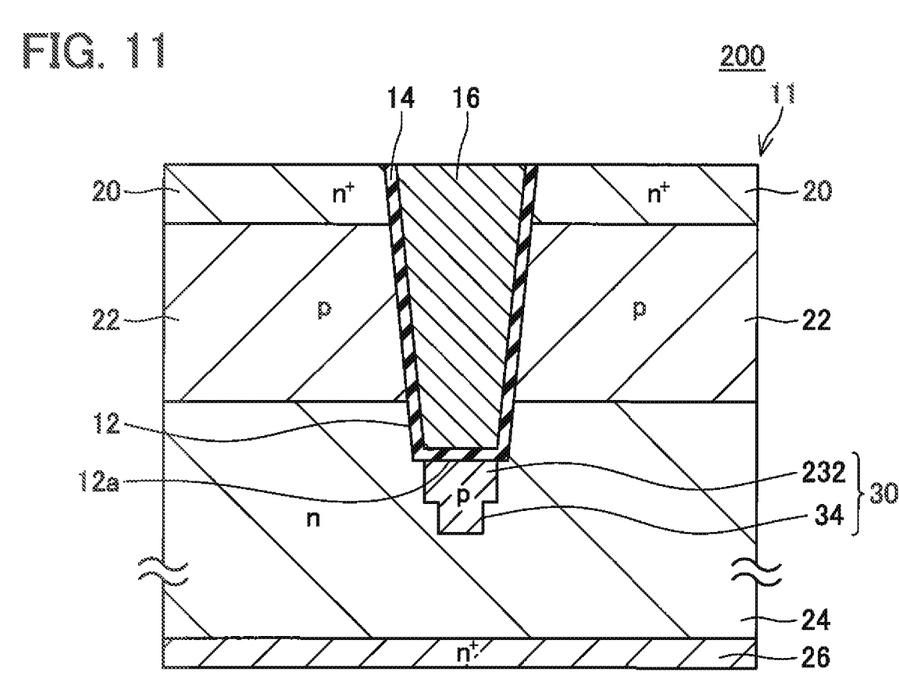
FIG. 11 is a schematic sectional view of a semiconductor 200 of a fourth embodiment.

A fourth embodiment is explained, focusing on different points from the first embodiment. As shown in FIG. 11, also in a semiconductor device 200 of this embodiment, a configuration of a first layer 232 of a floating region 30 is different from that in the first embodiment. In this embodiment, a width of the first layer 232 is formed narrower than the width of the bottom 12a of the trench 12. Accordingly, in the semiconductor device 200 of this embodiment, since the spread of a depletion layer in the lateral direction is suppressed, an on-resistance can be reduced.

A manufacturing method of the semiconductor device 200 of this embodiment is fundamentally common to the manufacturing method of the second embodiment mentioned above. However, in this embodiment, when the p-type impurities are injected to the bottom 12a of the trench 12 by the first injection energy, a thickness of an oxide film, which has been formed in advance on the inner surface (at least on a side surface) of the trench 12, is thicker than that of the oxide film 80 of FIG. 8, which is a different point from the first embodiment. As a result, in this embodiment, by injecting the p-type impurities to the bottom 12a of the trench 12 by the first injection energy, the p-type region is formed in an area narrower than the width of the bottom 12a of the trench 12. Then, similarly to the second embodiment, as shown in FIG. 9, without removing the oxide film which has already been formed in the trench 12, a thick oxide film 90 is further formed, and then the p-type impurities are injected by the second injection energy. Each of subsequent processes is similar to that of the second embodiment.

While specific examples of the technology disclosed herein have been described above in detail, these examples are merely illustrative and place no limitation on the scope of the patent claims. The technology described in the patent claims also encompasses various changes and modifications to the specific examples described above. For example, the following modifications may be adopted.

(Modification 1) In each of the above mentioned embodiments, each of the semiconductor devices 10 (100, 200) is formed on the semiconductor substrate 11 which is mainly made of SiC. This places no limitation, and the semiconductor devices 10 (100, 200) may be formed on a semiconductor substrate 11 which is mainly made of Si.

(Modification 2) In each of the above mentioned embodiments, explanations are made in cases that the semiconductor devices 10 (100, 200) are MOSFETs. This places no limitation, and the technology disclosed in the present disclosure can be adopted also in a case that a semiconductor device is an IGBT (Insulated Gate Bipolar Transistor).

(Modification 3) In the first embodiment mentioned above, as shown in FIG. 5, although the sacrificial oxide film 60 is formed on the entire inner surface (the side surface and the bottom surface 12a) of the trench 12, a place in which the sacrificial oxide film 60 is formed is not limited to this; if the sacrificial oxide film 60 is formed to cover at least the side surface of the trench 12, it may be formed on an arbitrary part.

The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

The invention claimed is:

1. A manufacturing method of a semiconductor device, the method comprising:
    forming a trench extending from a front surface of a semiconductor substrate in a depth direction;

injecting impurities of a second conductivity type to a bottom of the formed trench by first injection energy;

forming a first protective film covering at least a side surface of the trench after the impurities of the second conductivity type had been injected to the bottom of the trench; and further injecting impurities of the second conductivity type to the bottom of the trench by second injection energy that is larger than the first injection energy, after the first protective film had been formed, wherein:

the injection of the impurities by the first injection energy includes (i) injecting impurities of the second conductivity type in a state where no protective film is formed on at least the side surface of the formed trench, or (ii) injecting impurities of the second conductivity type in a state where a second protective film, that is thinner than the first protective film, is formed on at least the side surface of the formed trench; and a bottom surface of a first region formed by the injection of the impurities of the second conductivity type by the first injection energy is in direct contact with an upper surface of a second region formed by the further injection of the impurities of the second conductivity type by the second injection energy.

2. The manufacturing method of a semiconductor device as in claim 1, wherein
the first protective film is a sacrificial oxide film formed by oxidation of the front surface of the semiconductor substrate, and
the manufacturing method of a semiconductor device further comprises:
removing the sacrificial oxide film after the impurities of the second conductivity type had been injected by the second injection energy.

3. The manufacturing method of a semiconductor device as in claim 1, wherein
the injection of the impurities by the first injection energy includes injecting impurities of the second conductivity type in the state where no protective film is formed on at least the side surface of the formed trench.

4. The manufacturing method of a semiconductor device as in claim 1, wherein
the injection of the impurities by the first injection energy includes injecting impurities of the second conductivity type in the state where the second protective film is formed on at least the side surface of the formed trench.

* * * * *